US009646920B2

(12) United States Patent
Gao et al.

(10) Patent No.: US 9,646,920 B2
(45) Date of Patent: May 9, 2017

(54) POWER SEMICONDUCTOR DEVICE WITH SMALL CONTACT FOOTPRINT AND THE PREPARATION METHOD

(71) Applicant: Alpha and Omega Semiconductor (Cayman), Ltd, Sunnyvale, CA (US)

(72) Inventors: Hongtao Gao, Shanghai (CN); Jun Lu, San Jose, CA (US); Ming-Chen Lu, Shanghai (CN); Jianxin Ye, Shanghai (CN); Yan Huo, Shanghai (CN); Hua Pan, Shanghai (CN)

(73) Assignee: ALPHA AND OMEGA SEMICONDUCTOR (CAYMAN), LTD, Grand Cayman (KY)

( * ) Notice: Subject to any disclaimer, the term of this patent is extended or adjusted under 35 U.S.C. 154(b) by 137 days.

(21) Appl. No.: 14/298,892

(22) Filed: Jun. 7, 2014

(65) Prior Publication Data
US 2015/0357268 A1    Dec. 10, 2015

(51) Int. Cl.
*H01L 23/495*    (2006.01)
*H01L 23/00*    (2006.01)
(Continued)

(52) U.S. Cl.
CPC .... *H01L 23/49575* (2013.01); *H01L 23/3672* (2013.01); *H01L 23/49524* (2013.01); *H01L 23/49541* (2013.01); *H01L 23/49548* (2013.01); *H01L 23/49562* (2013.01); *H01L 24/97* (2013.01); *H01L 21/561* (2013.01); *H01L 23/3121* (2013.01); *H01L 24/05* (2013.01); *H01L 24/06* (2013.01); *H01L 24/29* (2013.01); *H01L 24/32* (2013.01); *H01L 24/33* (2013.01); *H01L 2224/05552* (2013.01); *H01L 2224/05553* (2013.01); *H01L 2224/06051* (2013.01); *H01L 2224/06181* (2013.01); *H01L 2224/131* (2013.01); *H01L 2224/16245* (2013.01);
(Continued)

(58) Field of Classification Search
CPC .......... H01L 23/49575; H01L 23/4903; H01L 23/4951; H01L 23/49537; H01L 23/49541; H01L 23/49548; H01L 23/49558; H01L 23/49586; H01L 24/96; H01L 24/97
See application file for complete search history.

(56) References Cited

U.S. PATENT DOCUMENTS

| | | | |
|---|---|---|---|
| 2010/0308421 A1* | 12/2010 | Muto | H01L 25/074 257/401 |
| 2012/0015483 A1* | 1/2012 | Herbsommer | H01L 23/4334 438/113 |

(Continued)

*Primary Examiner* — Mark Tornow
*Assistant Examiner* — Abbigale Boyle
(74) *Attorney, Agent, or Firm* — Chein-Hwa S. Tsao; Chen-Chi Lin

(57) ABSTRACT

A power semiconductor package has a small footprint. A preparation method is used to fabricate the power semiconductor package. A first semiconductor chip and a second semiconductor chip are attached to a front side and a back side of a die paddle respectively. Conductive pads are then attached to electrodes at top surfaces of the first and second semiconductor chips. It is followed by a formation of a plastic package body covering the die paddle, the first and second semiconductor chips, and the conductive pads. Side surfaces of the conductive pads are exposed from a side surface of the plastic package body.

8 Claims, 12 Drawing Sheets

(51) Int. Cl.
*H01L 23/367* (2006.01)
*H01L 23/31* (2006.01)
*H01L 21/56* (2006.01)

(52) U.S. Cl.
CPC .............. *H01L 2224/291* (2013.01); *H01L 2224/32245* (2013.01); *H01L 2224/33181* (2013.01); *H01L 2224/40247* (2013.01); *H01L 2224/73263* (2013.01); *H01L 2224/83805* (2013.01); *H01L 2224/97* (2013.01); *H01L 2924/13091* (2013.01); *H01L 2924/18161* (2013.01)

(56) References Cited

U.S. PATENT DOCUMENTS

2013/0147029 A1* 6/2013 Gao ................. H01L 23/492
 257/735
2014/0361420 A1* 12/2014 Yilmaz ............. H01L 23/4952
 257/676

* cited by examiner

POWER SEMICONDUCTOR DEVICE WITH SMALL CONTACT FOOTPRINT AND THE PREPARATION METHOD

FIELD OF PRESENT INVENTION

The present invention mainly relates to a power semiconductor package, and more particularly to a power semiconductor device with a small contact footprint and a preparation method thereof.

BACKGROUND OF RELATED ART

In the applications of a power transistor, the overall dimension and heat dissipation are two important parameters of the device. The heat dissipation of the device is generally improved by exposing part of the electrode of the transistor, but the implementation process is very complicated. In switching circuits such as synchronous buck converters, half bridge converter and inverters, two power MOSFETs are switched in complementary fashion.

As shown in FIG. 1A, U.S. Pat. No. 7,485,954 discloses a stacked dual MOSFET package. The integrated circuit package includes a high side MOSFET die 230 coupled to a first conductive tab 210 such that a drain of the high side MOSFET die 230 is attached on and electrically connected to the first conductive tab 210; a second conductive tab 243 attached on and electrically connected to a source of the high side MOSFET die 230; and a low side MOSFET die 250 coupled to the second conductive tab 243 such that a drain of the low side MOSFET die 250 is attached on and electrically connected to the second conductive tab 243. The high side MOSFET die 230, the low side MOSFET die 250, the first conductive tab 210 and the second conductive tab 243 are stacked so that the second conductive tab 243 electrically contacts with a top electrode of the high side MOSFET die 230 and a bottom electrode of the low side MOSFET die 250, and the bottom surface 215 of the conductive tab 210 and the bottom surface 247 of the conductive tab 240 are coplanar.

Furthermore, as shown in FIG. 1B, U.S. Pat. No. 8,519,520 discloses a semiconductor device package with a high-side chip and a low-side chip and a manufacturing method thereof. In the device, the low-side chip 200 and the high-side chip 300$p$ are attached to the two opposite sides of a lead frame respectively, so that a bottom drain electrode of the low-side chip 200 is electrically connected to a top side of a die paddle 110 and a top source electrode of the high-side chip 300$p$ is electrically connected to a bottom side of the die paddle 110 through solder balls 311. A top gate electrode of the low-side chip 200 is connected to a pin 122 of the lead frame by a metal clip 230$p$ and the top gate electrode of the high-side chip 300$p$ are connected to a pin 123 of the lead frame, where the pins 122 and 123 are coplanar. In the invention, the stacking structure of the low-side chip 200, the die paddle 110 of a lead frame 100 and the high-side chip 300$p$ reduces the package size. After encapsulating the low-side chip 200, the die paddle 110 of a lead frame 100 and the high-side chip 300$p$ with a package body 400$p$, a metal layer 320 (or a conductive layer 320') covering the back side of the high-side chip 300$p$ is exposed outside of a package body 400$p$ at the bottom surface of the semiconductor device to improve the heat dissipation of the device.

The prior art semiconductor device packages of FIG. 1A and FIG. 1B cannot provide the best heat dissipation and the device has a relatively large footprint, for example the size of a pin or a metal clip cause the device to occupy a large area on a PCB circuit board.

It is within this context that embodiments of the present invention arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Figure 1A:
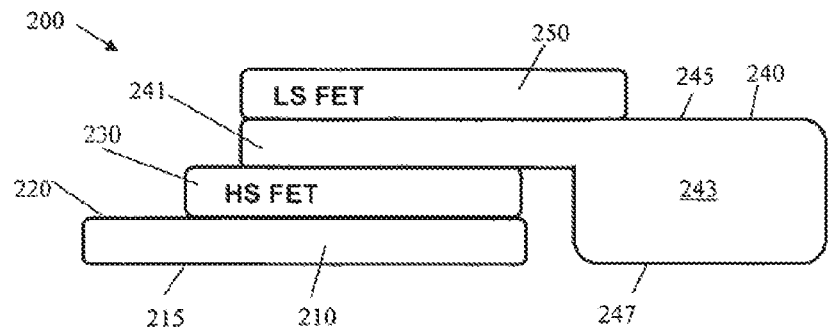
FIG. 1A and FIG. 1B are schematic diagrams illustrating the conventional power semiconductor packages.
Figure 1B:
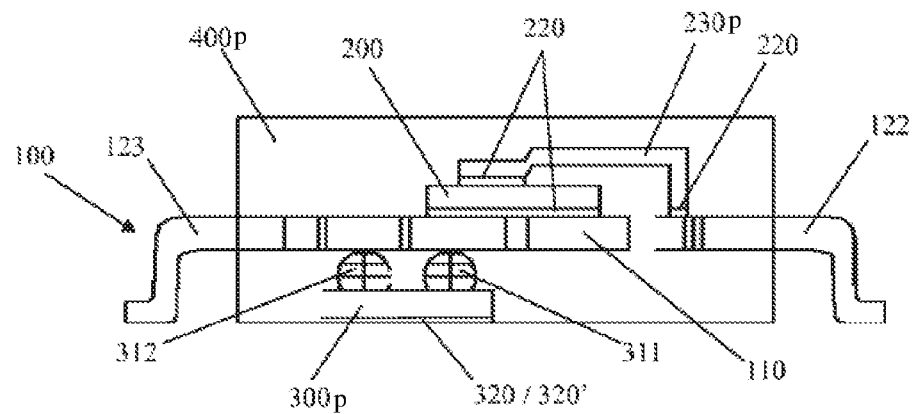
Figure 2A:
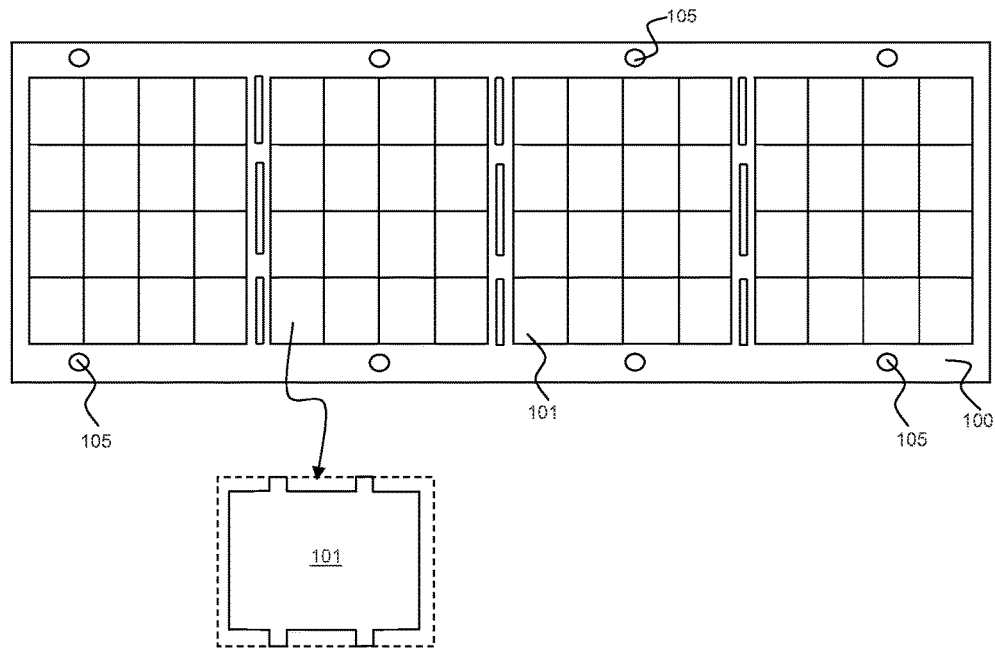
FIG. 2A to FIG. 2I are schematic diagrams showing the steps of a method for preparing a stacked power semiconductor device with a small contact footprint at the device's side surface according to an embodiment of the present invention.

As shown in FIG. 2A, a lead frame 100 includes a plurality of die paddles 101 and a plurality of positioning holes 105 formed at the edge of the lead frame 100 (the number or orientation of the positioning holes 105 are shown in this Fig. as an example). The die paddle 101 is generally in a square structure, which has a front side and a back side opposed to each other. It is well known in the art that the die paddle 101 is connected together within the lead frame 100 or to the support bars of the lead frame 100 through a plurality of connecting ribs. The lead frame 100 is also defined as the first lead frame.

Figure 2B:
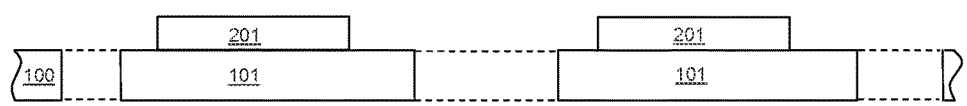

As shown in FIG. 2B, with the existing surface mount technology, a plurality of first semiconductor chips 201 are attached on the front side of the plurality of die paddle 101 one to one via conductive bonding material (such as solder paste, conductive paste and the likes or an eutectic solder). The first semiconductor chip 201 is a vertical power MOSFET, which has some electrodes at the top surface and one electrode at the bottom surface and the current flows from the top to the bottom or vice versa. The first semiconductor chip 201 is attached on the front side of the die paddle 101, where the bottom electrode of the first semiconductor chip 201 is electrically connected with the die paddle 101. It should be noted that in this step, both the lead frame 100 and each die paddle 101 face up.

Figure 2C:
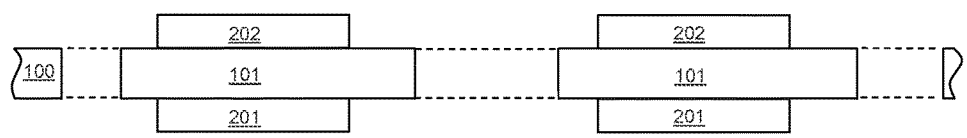

In FIG. 2C, the lead frame 100 is flipped so that the back side of the lead frame faces up and the front side thereof faces down. As such, each die paddle 101 and the first semiconductor chip 201 attached thereto are also flipped. Then, a plurality of second semiconductor chips 202 are also attached to the back side of the plurality of die paddle 101 one to one. The second semiconductor chip 202 is also a vertical power MOSFET. The bottom of the second semiconductor chip 202 is attached to the back side of the die paddle 101, where the bottom electrode of the second semiconductor chip 202 is electrically connected to the back side of the die paddle 101. As a result, both the front side and the back side of each die paddle 101 are correspondingly attached with one first semiconductor chip 201 and one second semiconductor chip 202.

Figures 1, 2, 2D:
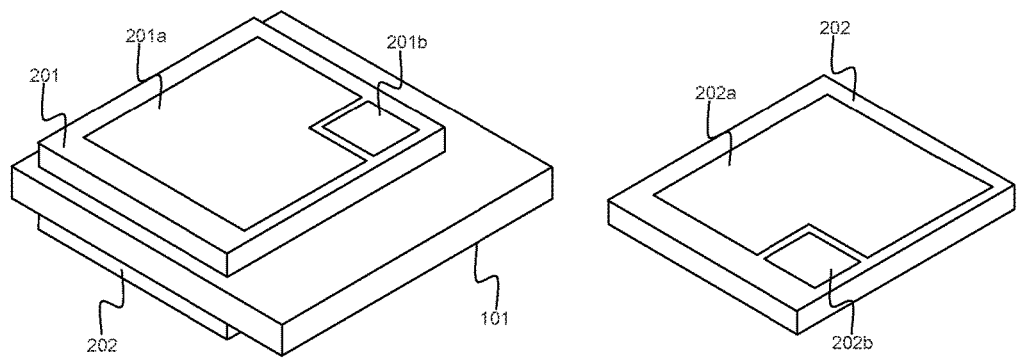

FIG. 2D-1 is a perspective view illustrating one die paddle 101 with one first semiconductor chip 201 attached on its front side and one second semiconductor chip 202 attached on it back side for demonstration, but it should be emphasized that no cutting step is performed for the lead frame 100 at this stage. As shown in FIG. 2D-1, an electrode 201a and an electrode 201b are formed at the top surface of the first semiconductor chip 201 (the electrode at the back of the first semiconductor chip 201 is not shown). Similarly, an electrode 202a and an electrode 202b are formed at the top surface of the second semiconductor chip 202 as shown in FIG. 2D-2 (the electrode at the back of the second semiconductor chip 202 is not shown).

Figures 1, 2E:
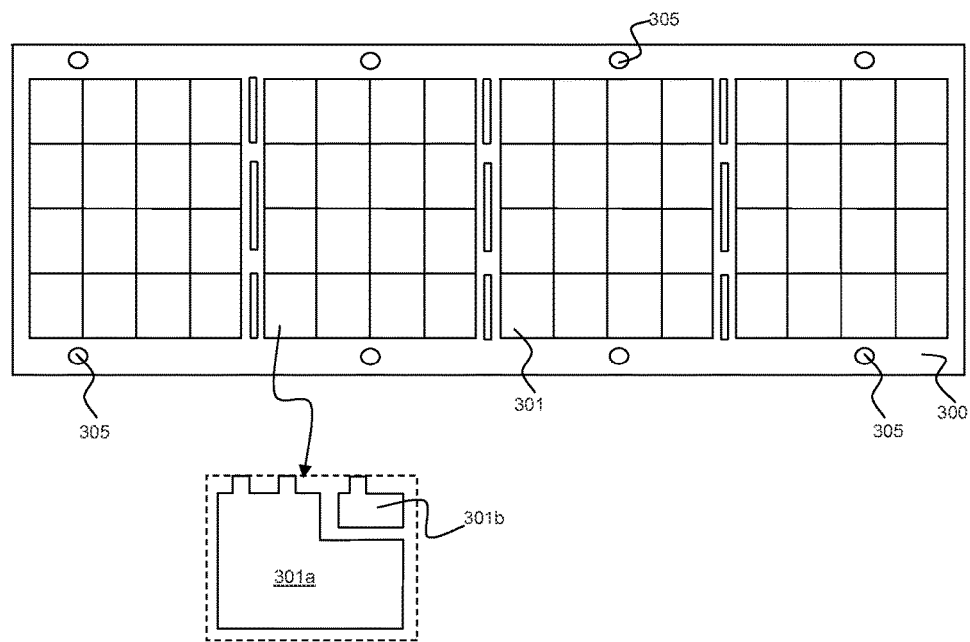
Figures 2, 2E:
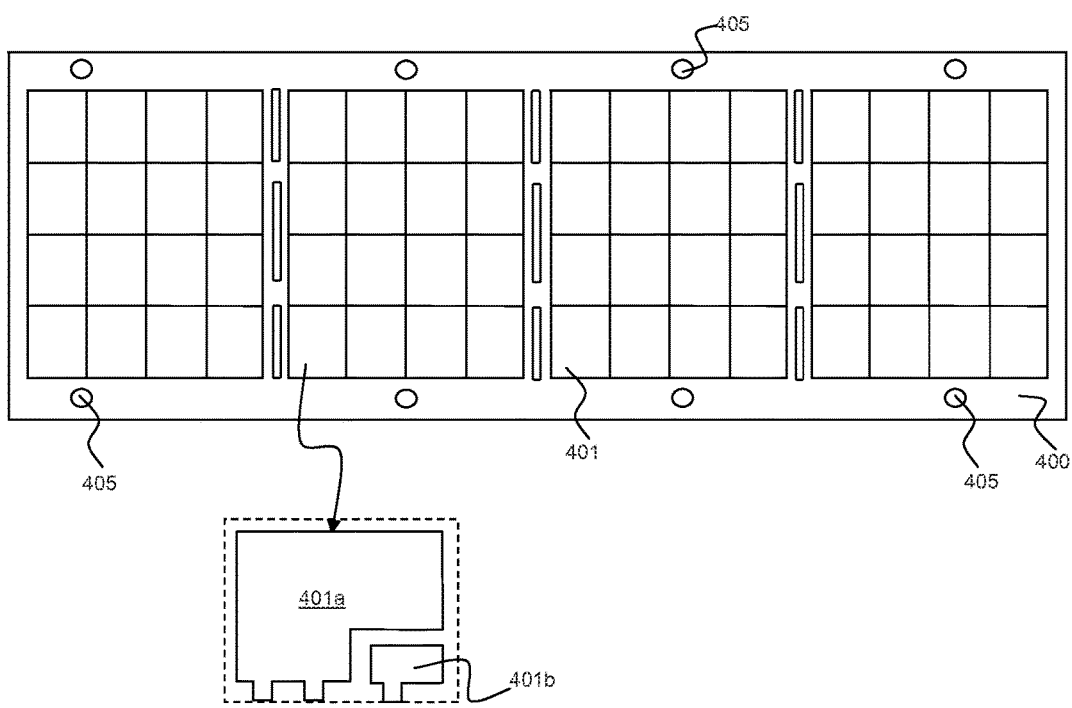

In FIG. 2E-1, a lead frame 300, which is defined as the second lead frame, includes a plurality of conductive units 301, each of which comprises one or more conductive pads separated from each other; for example, in one embodiment, the conductive unit 301 comprises a first conductive pad 301a and a second conductive pad 301b. The first conductive pad 301a is larger than the second conductive pad 301b. The first conductive pad 301a has an L-shape with a notch formed at one corner, and the second conductive pad 301b is arranged inside the notch so that the overall size of the conductive unit 301 is minimized. It is well known in the art that the first conductive pad 301a and the second conductive pad 301b are connected together within the lead frame 300 through a plurality of connecting ribs. The lead frame 300 also includes positioning holes 305 formed at the edge of the lead frame 300 in positions corresponding to positioning holes 105.

As shown in FIG. 2E-2, a third lead frame 400, similar to the lead frame 300, includes a plurality of conductive units 401, each of which comprises one or more conductive pads separated from each other; for example, in one embodiment, the conductive unit 401 comprises a first conductive pad 401a and an a second conductive pad 401b, where the first conductive pad 401a is larger than the second conductive pad 401b. The first conductive pad 401a has an L-shape with a notch formed at one corner, and the second conductive pad 401b is arranged inside the notch so that the overall size of the conductive unit is minimized. The third lead frame 400 also includes positioning holes 405 formed at the edge of the lead frame 400 in positions corresponding to positioning holes 105.

Figure 2F:
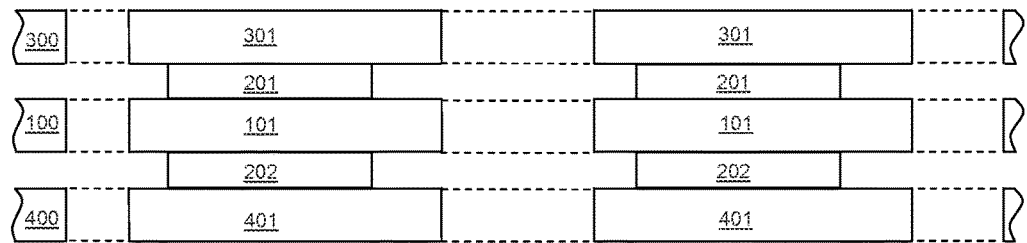
Figure 2G:
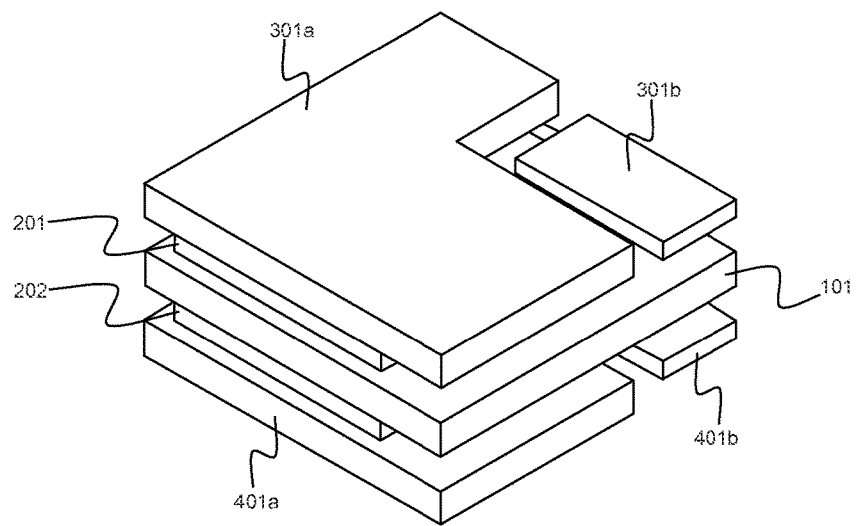

As shown in FIG. 2F, the second lead frame 300 with the plurality of conductive units 301 is mounted on the plurality of first semiconductor chips 201, where each conductive unit 301 is mounted on each first semiconductor chip 201 so that one first conductive pad 301a is aligned with and attached on the electrode 201a at the top surface of the first semiconductor chip 201 and one second conductive pad 301b is aligned with and attached on the electrode 201b at the top surface of the first semiconductor chip 201. Thus, the third lead frame 400 with the plurality of conductive units 401 is mounted on the plurality of second semiconductor chips 202, where one conductive unit 401 is mounted on each second semiconductor chip 202 so that one conductive pad 401a is aligned with and attached on the electrode 202a at the top surface of the second semiconductor chip 202 and one conductive pad 401b is aligned with and attached on the electrode 202b at the top surface of the second semiconductor chip 202. In a preferred embodiment, the lead frame 100 of FIG. 2C may be flipped back, where the front surface of the lead frame 100 and the attached first semiconductor chip 201 face up, following with the mounting of the lead frame 300 on the top surface of the first semiconductor chips, and then the lead frame 100 is flipped again, where the back surface of the lead frame 100 and the attached second semiconductor chips 202 face up, following with the mounting of the lead frame 400 on the second semiconductor chips 202. Alternatively, the lead frame 400 is directly mounted on the second semiconductor chips 202 of the lead frame of FIG. 2C firstly, and then the lead frame 100 is flipped back (the front surface of the lead frame 100 and the attached first semiconductor chip 201 face up), following with the mounting of the lead frame 300 on the first semiconductor chips 201. The cross-sectional drawing of FIG. 2F illustrates that the lead frame 300, the lead frame 400 and the lead frame 100 are parallel with each other with the first and second semiconductor chips 201, 201 sandwiched in between. At this time, one first semiconductor chip 201 and one second semiconductor chip 202 are attached to each die paddle 101, one conductive unit 301 is attached to each first semiconductor chip 201, and one conductive unit 401 is attached to each second semiconductor chip 202. FIG. 2G is a perspective view for demonstration without a cutting step of the lead frame 100, the lead frame 300 and the lead frame 400 showing one die paddle 101, the first semiconductor chip 201 and the second semiconductor chip 202 attached to its front side and its back side respectively, the conductive unit 301 and the conductive unit 401 attached on the top surfaces of the first semiconductor chip 201 and the second semiconductor chip 202 respectively.

As shown in FIG. 2G and FIG. 2D-1, one first conductive pad 301a is attached on the electrode 201a at the top surface of the first semiconductor chip 201 and one second conductive pad 301b is attached on the electrode 201b at the top surface of the first semiconductor chip 201. One first conductive pad 401a is attached on the electrode 202a at the top surface of the second semiconductor chip 202 and one second conductive pad 401b is attached on the electrode 202b at the top surface of the second semiconductor chip 202. The electrodes at the bottom surfaces of the first semiconductor chip 201 and the second semiconductor chip 202 are electrically connected to two opposite sides of the die paddle 101 respectively. In a power management system, the first semiconductor chip 201 and the second semiconductor chip 202 are functioned as a pull-up transistor and a pull-down transistor respectively. Although the size of the first semiconductor chip 201 is slightly different from the size of the second semiconductor chip 202 the electrode 201a of the first semiconductor chip 201 and the electrode 202a of the second semiconductor chip 202 are parallel to the plane of the die paddle 101. The electrode 201b of the first semiconductor chip 201 and the electrode 202b of the second semiconductor chip 202 are also parallel to the plane of the die paddle 101. As a result, the first conductive pad 301a and the first conductive pad 401a are also parallel to the plane of the die paddle 101 and the second conductive pad 301b and the second conductive pad 401b are parallel to the plane of the die paddle 101.

In FIG. 2G, the thickness of the first and second conductive pads 301a and 301b on the respective electrodes at the top surface of the first semiconductor chip 201 (or the thickness of the conductive pads 401a and 401b on the respective electrodes at the top surface the second semiconductor chip 202) is unequal. In a preferred embodiment, the first conductive pad 301a on the electrode 201a of the first semiconductor chip 201 is thicker than the second conductive pad 301b on the electrode 201b, and the first conductive pad 401a on the electrode 202a of the second semiconductor chip 202 is thicker than the second conductive pad 401b on the electrode 202b.

Figure 2H:
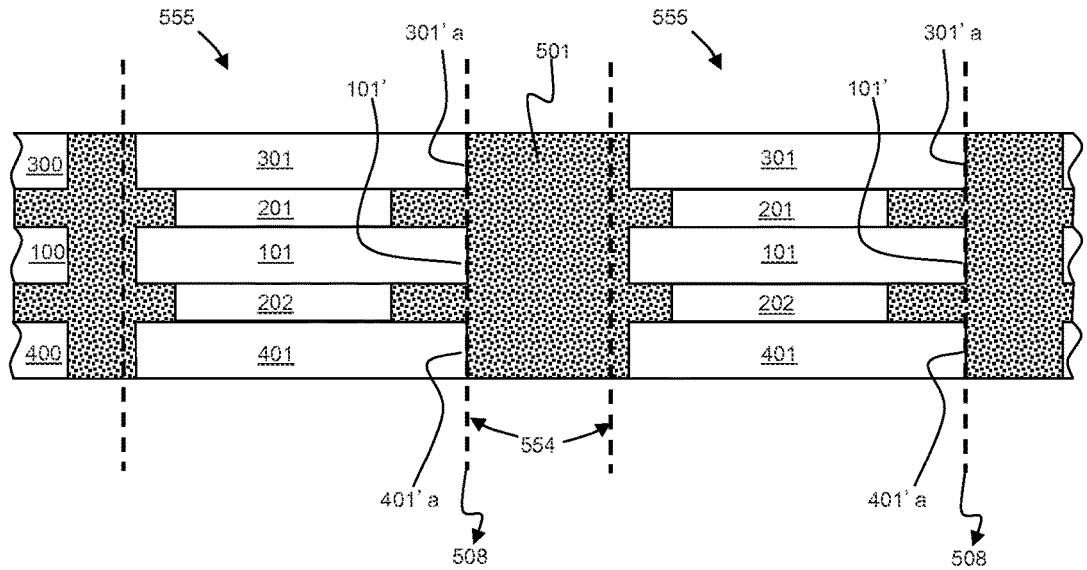

As shown in FIG. 2H, the bottom side of the first conductive pad 301a is attached to the electrode 201a of the first semiconductor chip 201 and the bottom side of the second conductive pad 301b is attached to the electrode 201b of the first semiconductor chip 201. The bottom side of the first conductive pad 401a is attached to the electrode 202a of the second semiconductor chip 202 and the bottom side of the second conductive pad 401b is attached to the electrode 202b of the second semiconductor chip 202. Thus, after a step of forming the plastic package, for example, a plastic package layer 501 of epoxy resin or molding compound is formed covering the lead frame 100, the lead frame 300 and the lead frame 400, as well as each first semiconductor chip 201 and each second semiconductor chip 202. The plastic package layer 501 is then ground to expose the top surfaces of the first conductive pad 301a of each conductive unit 301 and the first conductive pad 401a of each conductive unit 401, while the top surfaces of the thinner second conductive pad 301b and the thinner second conductive pads 401b are covered by the plastic package layer 501.

Figure 2I:
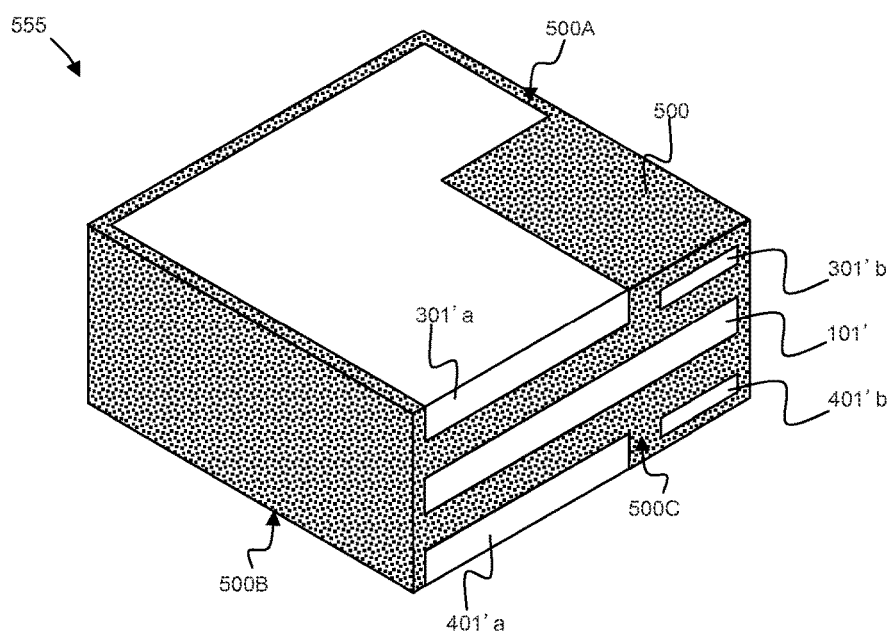

As shown in FIG. 2H and FIG. 2I, a side surface 101' of each die paddle 101, a side surface 301'a of the first conductive pad 301a, and a side surface 401'a of the first conductive pad 401a are located in the co-plane 508. In addition, a side surface 301'b of the second conductive pad 301b, and a side surface 401'b of second conductive pad 401b are also located in the co-plane 508. Therefore, before forming the plastic package layer 501, the side surfaces 101' of the die paddle 101 and the side surfaces 301'a, 401'a, 301'b and 401'b of the conductive pads 301a, 401a, 301b and 401b respectively must be located in the co-plane 508. As such, after the plastic package layer 501 is formed, the lamination including the lead frame 100, the lead frame 300 and the lead frame 400 and the plastic package layer 501 is cutting to obtain individual power semiconductor devices 555, one of which is shown in FIG. 2I, with the side surfaces 301'$_a$, 401'a, 301'b, 401'b and 101' exposed outside of a cutting side surface 500C of the plastic package body 500 formed by cutting the plastic package layer 501 along the co-plane 508. If the side surfaces of the die paddle 101 and the conductive pads 301a, 401a, 301b,401b are not originally located in a same plane, the co-plane side surfaces 101', 301'a, 401'a, 301'b, 401'b can be formed by cutting the die paddle 101 and the conductive pads 301a, 401a, 301b, 401b along a cutting surface, i.e., the side surface 500C. As such, the cut side surfaces 101', 301'a, 401'a, 301'b, 401'b are coplanar with the cutting surface of the plastic package body 500, i.e., the side edge surface 500C.

In the steps of FIG. 2H to FIG. 2I, the individual power semiconductor device 555 as shown in FIG. 2I are separated by cutting the lamination (comprising the lead frame 100, the lead frame 300, the lead frame 400 and the plastic package layer 501) between adjacent die paddles 101 along a cutting line 554 as shown in FIG. 2H. Each die paddle 101 and the first semiconductor chip 201 and the second semiconductor chip 202 attached thereto are covered by the plastic package body 500 formed by cutting the plastic package layer 501, which further covers the first conductive pad 301a and the conductive pad 301b at the top surface of the first semiconductor chip 201 attached on the die paddle 101 and the first conductive pad 401a and the second conductive pad 401b at the top surface of the second semiconductor chip 202 attached on the die paddle 101. In an embodiment, if the top surfaces of the first conductive pad 301a and the first conductive pad 401a are exposed outside of the plastic package layer 501 the top surfaces of the first conductive pad 301a and the first conductive pad 401a are exposed from the top and bottom surfaces 500A and 500B of the plastic package body 500. In addition, only the side surface 101' of the die paddle 101 is exposed outside of the side edge surface 500C of the plastic package body 500, i.e., the other three side surfaces of the die paddle are totally encapsulated by the plastic package body.

Figure 3A:
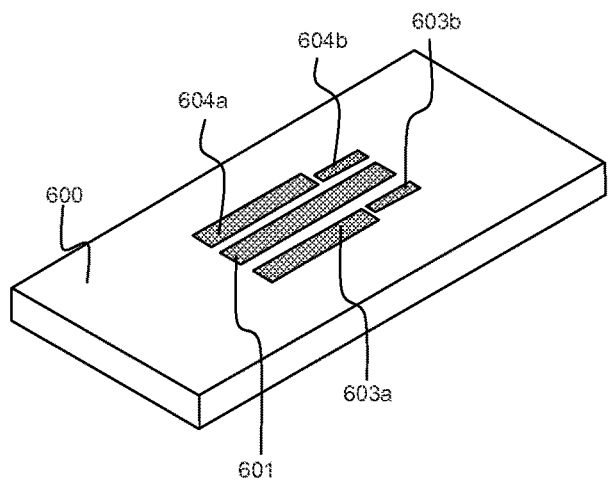
FIG. 3A to FIG. 3C are schematic diagrams showing the step of mounting the power semiconductor device of FIG. 2I on a PCB circuit board.
Figure 3B:
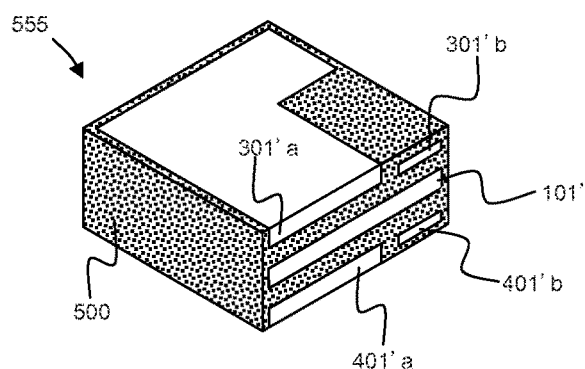
Figure 3C:
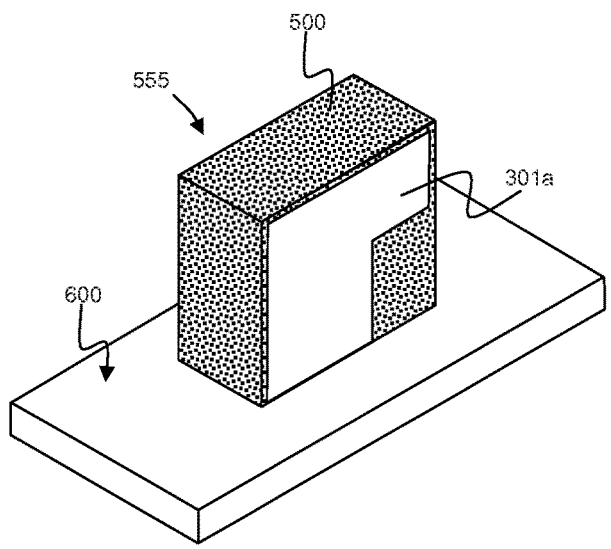

As shown in FIG. 3A, a PCB (Printed Circuit Board) 600 includes bonding pads 604a, 604b, 603a, 603b and 601 arranged on the contact surface of the PCB 600. The layout of these bonding pads is correspondingly the same as the layout the exposed side surfaces 301'a, 301'b, 401'a, 401'b and 101' on the side surface 500C of the power semiconductor device 555 (shown in FIGS. 2I and 3B). As shown in FIG. 3A and FIG. 3B, the size and the shape of the bonding pads 604a, 604b are essentially consistent with those of the exposed side surface 401'a, 401'b of the conductive pads 401a and 401b respectively. The size and the shape of the bonding pads 603a, 603b are essentially consistent with those of the exposed side surfaces 301'a, 301'b of the conductive pads 301a and 301b respectively. In addition, the size and the shape of the bonding pad 601 are essentially consistent with those of the exposed side surface 101' of the die paddle 101. As shown in FIG. 3C, the power semiconductor device 555 is mounted on the PCB via the surface mount technology, where the same size and shape bonding pad and the exposed side surface of the conductive pad are aligned with and welded with each other with the solder paste. At this time, both the top side 500A and the bottom side 500B of the plastic package body 500 are perpendicular to the contact surface of the PCB. With the traditional technology, if the top side 500A and the bottom side 500B of the plastic package body 500 are mounted on the PCB, it is required a larger area of the contact surface of the PCB because the areas of the top side 500A and the bottom side 500B of the plastic package body 500 is much larger than that of the side surface 500C, resulting in larger-sized device package. In the present invention, the top side 500A and the bottom side 500B of the power semiconductor device 555 are perpendicular to the contact surface of the PCB, and the smaller side surface 500C is mounted on the contact surface of the PCB, thus greatly reducing the occupied PCB area; therefore, providing a device with the small contact footprint.

Figure 4A:
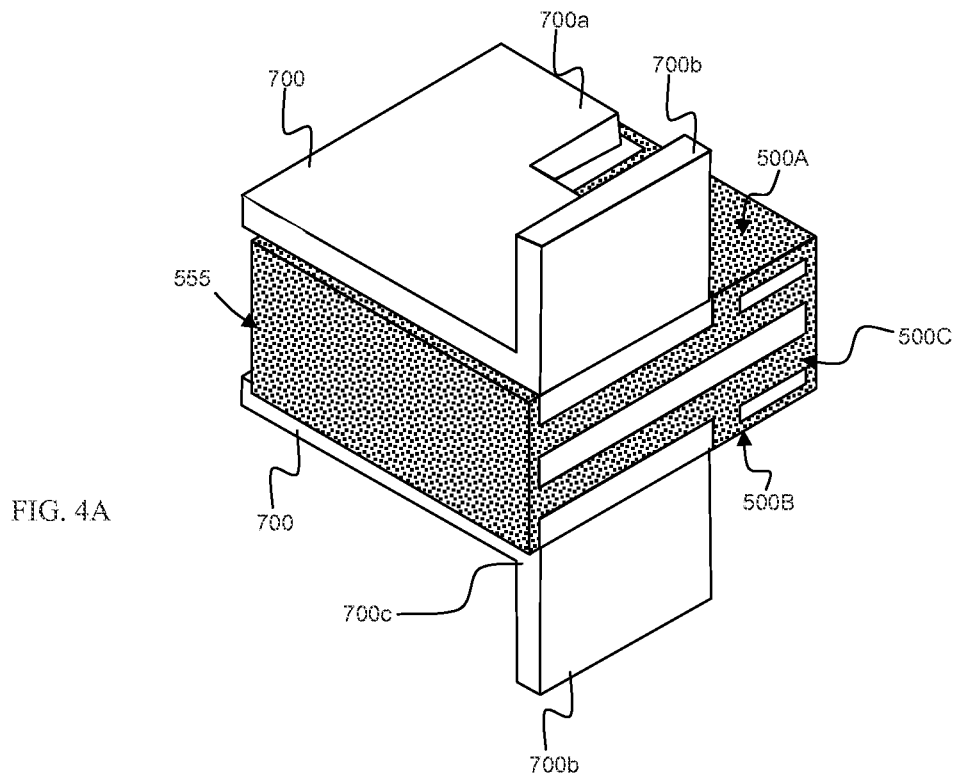
FIG. 4A to FIG. 4B are schematic diagrams showing the power semiconductor devices with heat sinks attached thereto.
Figure 4B:
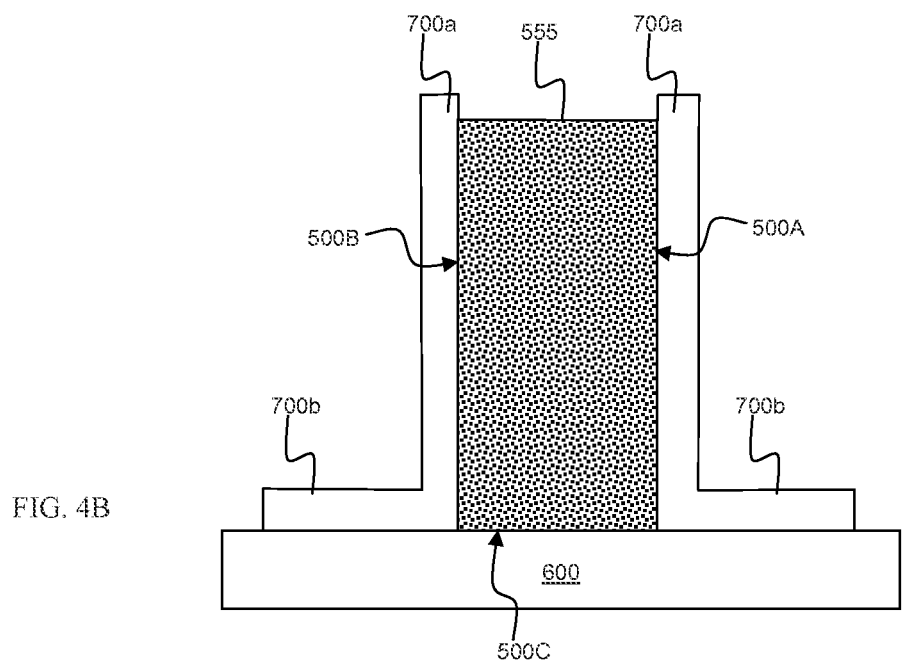

In the embodiments of FIG. 4A and FIG. 4B, an L-shaped heat sink 700a is attached to the exposed top surface of the first conductive pad 301a, where the shape and size of heat sink 700a are adjusted to match to those of the first conductive pad 301a, so that the L-shaped heat sink 700a can be in alignment with and overlapped with the first conductive pad 301a to achieve a maximum heat dissipation. In addition, an extension part 700b is perpendicular and connected to and extending out from the heat sink 700a at one edge 700c of the heat sink 700a, where the edge 700c of the heat sink 700a is flush with the side surface 500C of the plastic package body 500. In FIG. 4B, the power semiconductor device 555 is perpendicularly mounted on the contact surface of the PCB, and the extension part 700b is mounted on the contact surface of the PCB. The extension part 700b at two opposite sides of the power semiconductor device 555 are also electrically connected to the bonding pad 604a and the bonding pad 603a through a conductive binding material, such as solder paste, to increase the contact area between the first conductive pad 401a and the bonding pad 604a and the contact area between the first conductive pad 301a and the bonding pad 603a; as well as enhance the attach between the power semiconductor device 555 and the PCB. The extension part 700b is also used for heat dissipation of the device.

In one embodiment, when the first semiconductor chip 201 and the second semiconductor chip are MOSFETs, where the electrode 201b is the gate, the electrode 201a is the drain and the electrode at the back of the first semiconductor chip 201 is the source thereof (FIG. 2D-1), and the electrode 202b of the second semiconductor chip 202 is the gate, the electrode 202a is the source and the electrode at the back of the second semiconductor chip 202 is the drain (FIG. 2D-2), in the device of FIG. 2I, the side surface 101' of the die paddle 101 is required to be exposed outside, and the die paddle 101 is used as a coupling node LX between the pull-up transistor and the pull-down transistor to output voltage. In another embodiment, when the electrode 201b of the first semiconductor chip 201 is the gate, the electrode 201a is the source and the electrode at the back of the first semiconductor chip 201 is the drain (FIG. 2D-1), and electrode 202b of the second semiconductor chip 202 is the gate, the electrode 202a is the source and the electrode at the back of the second semiconductor chip 202 is the drain (FIG. 2D-2), the side surface 101' of the die paddle 101 is not required to be exposed outside of the side edge surface 500C of the device which is described in FIG. 5B.

Figure 5A:
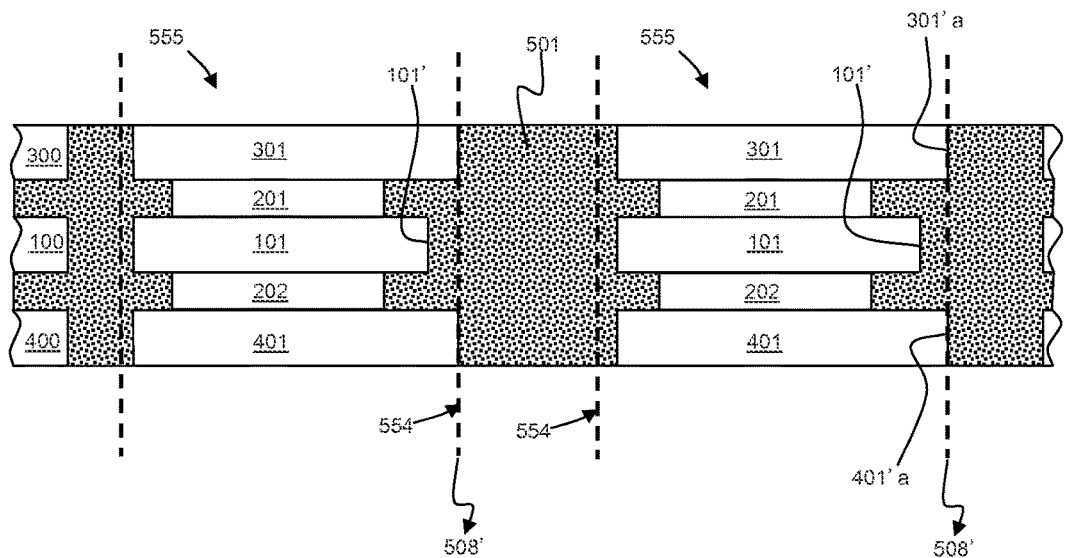
FIG. 5A to FIG. 5B are schematic diagrams showing a power semiconductor device with the die paddle not exposed outside of the plastic package body.
Figure 5B:
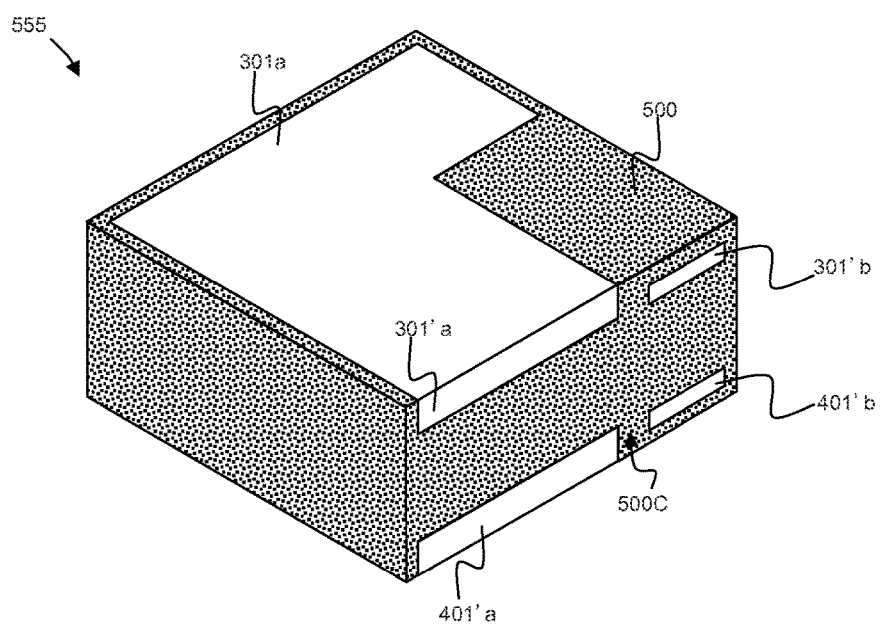

In one embodiment shown in FIG. 5A and FIG. 5B, the side surfaces 301'a and 301'b of the conductive pads 301a and 301b of the first semiconductor chip 201 and the side surfaces 401'a and 401'b of the conductive pads 401a and 401b attached on the second semiconductor chip 202 are located in the co-plane 508' excepting that the side surface 101' of the die paddle 101 is not located in the co-plane 508', in fact, the side surface 101' is close to the co-plane 508' and not extending out to the co-plane 508'. In the step of cutting the lamination along the co-plane 508' to separate individual devices 555, the side surfaces 301'a, 301'b, 401'a and 401'b of the conductive pads 301a, 301b, 401a and 401b respectively are exposed outside of the side edge surface 500C of the plastic package body 500, but the die paddle 101 is completely encapsulated inside the plastic package body 500. In one embodiment, when the first semiconductor chip 201 and the second semiconductor chip are MOSFETs, where the electrode 201b is the gate, the electrode 201a is the source and the electrode at the back of the first semiconductor chip 201 is the drain (FIG. 2D-1) and the electrode 202b of the second semiconductor chip 202 is the gate, the electrode 202a is the source, the electrode at the back of the second semiconductor chip 202 is the drain (FIG. 2D-2), the first semiconductor chip 201 and the second semiconductor chip 202 are configured with a common drain. In the case that the side surfaces 301'a, 401'a, 301'b,401'b of the conductive pads 301a, 401a, 301b,401b are not originally located in a same plane, the co-plane side surfaces 301'a, 401'a, 301'b, 401'b can be formed by cutting the conductive pads 301a, 401a, 301b, 401b along a cutting surface, i.e., the side surface 500C. As such, the cut side surfaces 301'a, 401'a, 301'b, 401'b are coplanar with the cutting surface of the plastic package body 500, i.e., the side edge surface 500C. The side surface 101' of the die paddle 101 is close to the cutting surface 500C but is not exposed from the cutting surface 500C.

Figure 6A:
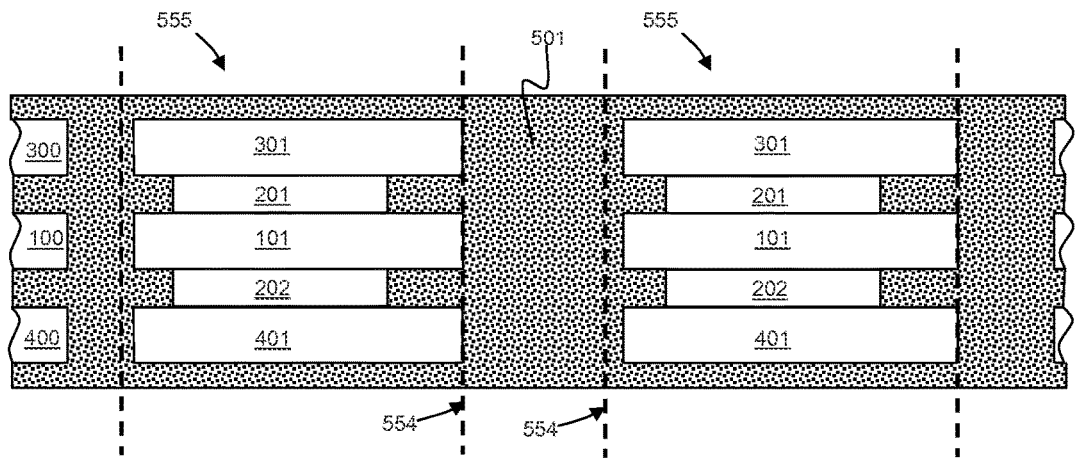
FIG. 6A to FIG. 6B are schematic diagrams showing a power semiconductor device with the top surface of the first conductive pads attached on the top surfaces of the first and second semiconductor chips not exposed outside of the plastic package body.
Figure 6B:
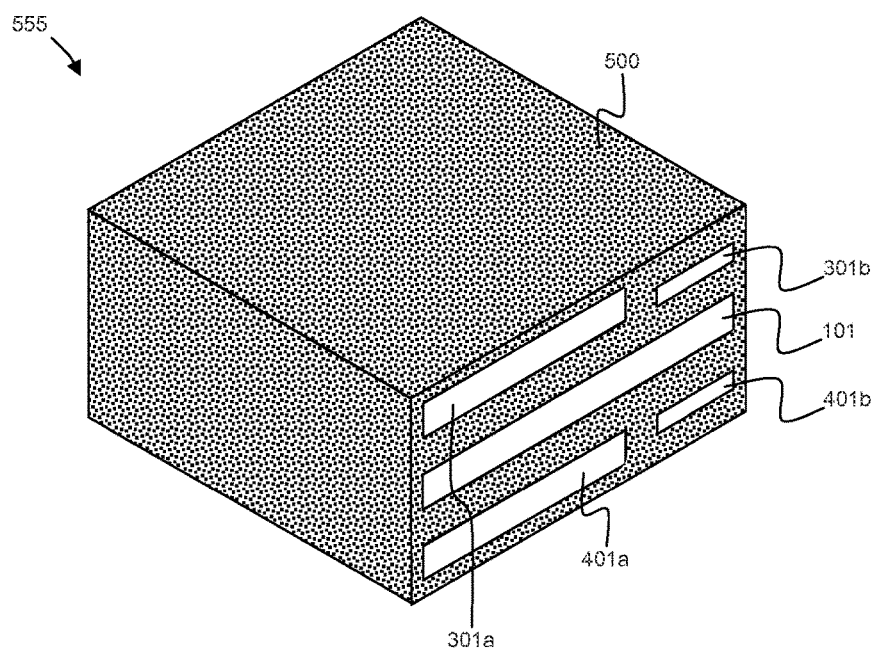

In another embodiment, as shown FIG. 6A and FIG. 6B, the second lead frame 300 and/or the third lead frame 400 can be totally covered by the plastic package layer 501. If each conductive unit 301 in the second lead frame 300 and each conductive unit 401 in the third lead frame 400 are covered by the plastic package layer 501, the top surface of the conductive pad 301a and/or the top surface of the conductive pad 401a may not be exposed outside of the top side and bottom side of the plastic package layer 501 respectively. As shown in FIG. 6B, the respective top surfaces of the conductive pads 301a, 301b, 401a and 401b are totally covered by the plastic package body 500, but the side surface of each conductive pad is exposed outside of the side surface 500C of the plastic package body 500 (similar to FIG. 2I).

Figure 7A:
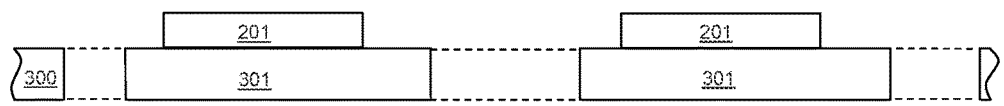
FIG. 7A to FIG. 7D are schematic diagrams showing the alternative steps of the method for preparing a power semiconductor device of FIG. 2I.
Figures 1, 7B:
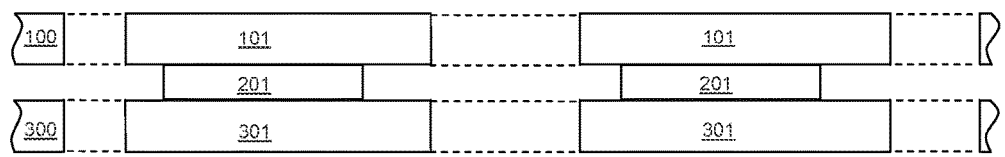
Figures 2, 7B:
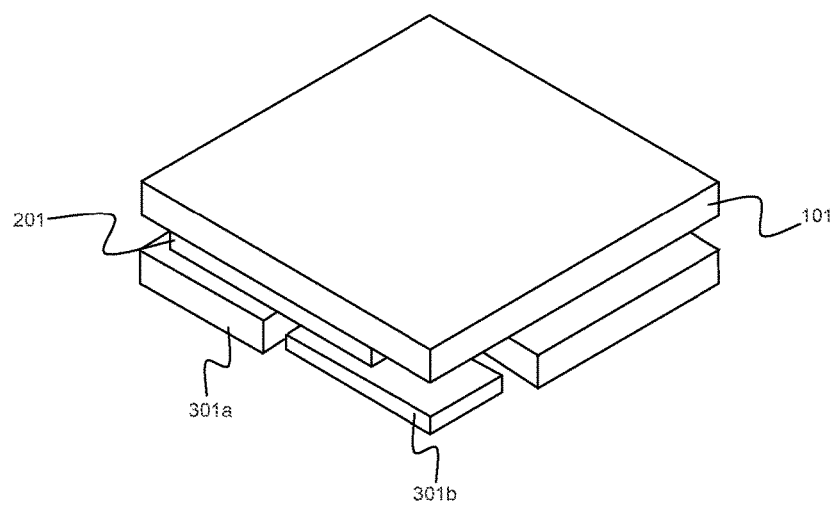
Figures 1, 7C:
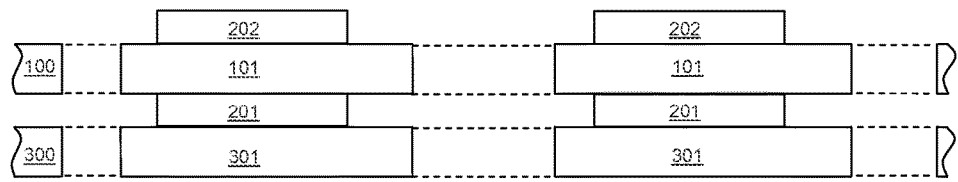
Figures 2, 7C:
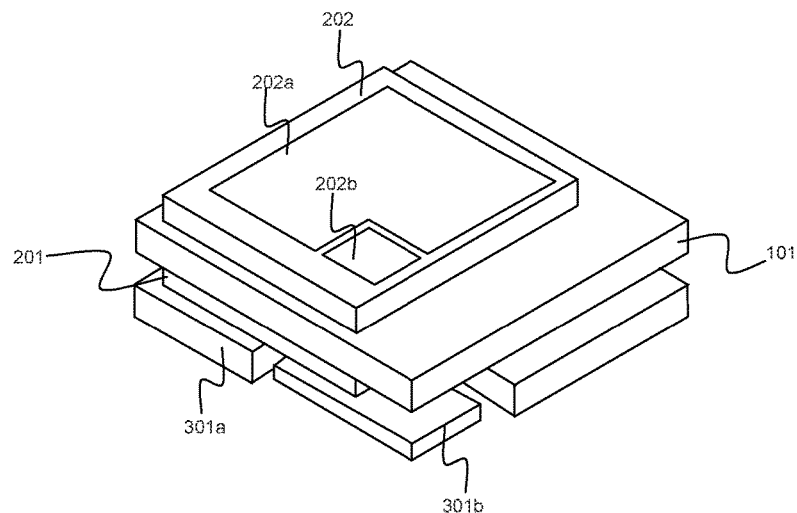
Figure 7D:
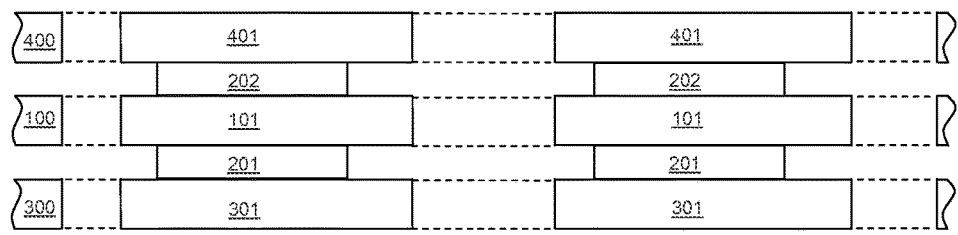

FIG. 7A to FIG. 7D illustrate the alternative steps of a method forming the power device 555 that can be replaced for those in FIG. 2A to FIG. 2F. In this embodiment, the lead frame 100 is not required to be flipped. In FIG. 7A, the process starts with the lead frame 300, where its bottom side and each conductive pad thereof face up. The first semiconductor chip 201 is flipped and attached on the conductive unit 301 of the lead frame 300, so that the first conductive pad 301a is aligned with and attached to the electrode 201a at the top surface of each first semiconductor chip 201, and the second conductive pad 301b is aligned with and attached to the electrode 201b at the top surface of each first semiconductor chip 201. As shown in FIG. 7B-1 and FIG. 7B-2, the first lead frame 100 with the plurality of die paddles 101 is mounted on the plurality of first semiconductor chips 201, so that the electrode at the back of each first semiconductor chip 201 is aligned with, attached and electrically connected to the back side of the die paddle 101. As shown in FIG. 7C-1 and FIG. 7C-2, the second semiconductor chip 202 is then attached to the front side of each die paddle 101, where the electrode at the bottom surface of the second semiconductor chip 202 is attached and electrically connected to the front side of the die paddle 101. As shown in FIG. 7D, the third lead frame 400 with the plurality of conductive units 401 is mounted on the plurality of second semiconductor chips 202, so that the first conductive pad 401a is aligned with and attached to the electrode 202a at the top surface of each second semiconductor chip 202 and the second conductive pad 401b is aligned with and attached to the electrode 202b at the top surface of each second semiconductor chip 202. The structure shown in FIG. 7D, comprising the first semiconductor chip 201, the second semiconductor chip 202, the lead frame 100, the lead frame 300 and the lead frame 400, maybe flipped to obtain the structure as shown in FIG. 2F and FIG. 2G (but in fact, it is unnecessary to flip), and the other subsequence steps of the method as shown in FIG. 2H to FIG. 2I are then performed to complete the process of making the device 555.

The layouts of the positioning holes 105 arranged at the edge of the first lead frame 100, the positioning holes 305 arranged at the edge of the second lead frame 300 and the positioning holes 405 arranged at the edge of the third lead frame 400 are the same so that the second and third lead frames 300, 400 may be precisely aligned with and positioned with the first lead frame 100 when the second lead frame and the third lead frame 300, 400 are mounted on the first and second semiconductor chips 201, 202 attached on front and back sides of the first lead frame. In other words, the self-alignment is performed along the vertical direction, for example, a preset positioning pin passes through the positioning holes 105, 305, 405 of the lead frame 100, the lead frame 300 and the lead frame 400 that are aligned with and overlapped with each other along the vertical direction.

The above detailed descriptions are provided to illustrate specific embodiments of the present invention and are not intended to be limiting. Numerous modifications and variations within the scope of the present invention are possible. The present invention is defined by the appended claims.

What is claimed is:

1. A preparation method of a power semiconductor device, the preparation method comprising:
    providing a first lead frame with a plurality of die paddles;
    attaching a respective first semiconductor chip to a front side of each die paddle;
    flipping the first lead frame with the respective first semiconductor chip attached to said each die paddle and then attaching a respective second semiconductor chip to a back side of said each die paddle;
    providing a second lead frame with a first plurality of conductive pads to mount on the plurality of first semiconductor chips, wherein a respective conductive pad of the first plurality of conductive pads is attached to an electrode on a top surface of each first semiconductor chip;
    providing a third lead frame with a second plurality of conductive pads to mount on the plurality of second semiconductor chips, wherein a respective conductive pad of the second plurality of conductive pads is attached to an electrode on a top surface of each second semiconductor chip;
    forming a plastic package layer covering the first lead frame, the second lead frame, the third lead frame, the plurality of first semiconductor chips and the plurality of second semiconductor chips so as to form a lamination; and
    cutting the lamination along cutting lines between adjacent die paddles,
    wherein each plastic package body of a plurality of plastic package bodies, formed by cutting the plastic package layer, covers a respective die paddle, a respective first semiconductor chip, a respective second semiconductor chip, one or more conductive pads of the first plurality of conductive pads and one or more conductive pads of the second plurality of conductive pads,
    wherein a side surface of each conductive pad of the first and second pluralities of conductive pads is exposed from a respective cutting side surface of the plurality of plastic package bodies;
    wherein a respective side surface of the conductive pad of the first plurality of conductive pads, the respective cutting side surface of the plurality of plastic package bodies and a side surface of each conductive pad of the second plurality of conductive pads are located in a co-plane and
    wherein a respective side surface of the conductive pad of the first plurality of conductive pads, a respective side surface of the conductive pad of the second plurality of conductive pads and a side surface of each die paddle of the plurality of die paddles are located in a co-plane.

2. The preparation method of claim 1, wherein a plurality of electrodes on bottom surfaces of the plurality of first semiconductor chips are attached to the front sides of the plurality of die paddles and wherein a plurality of electrodes on bottom surfaces of the plurality of second semiconductor chips are attached to the back sides of the plurality of die paddles.

3. The preparation method of claim 1, wherein said each plastic package body covers respective top surfaces of the one or more conductive pads of the first plurality of conductive pads and respective top surfaces of the one or more conductive pads of the second plurality of conductive pads.

4. The preparation method of claim 1, wherein a top surface of each conductive pad of the first plurality of conductive pads is exposed from a respective plastic package body.

5. The preparation method of claim 1, wherein a top surface of each conductive pad of the second plurality of conductive pads is exposed from a respective plastic package body.

6. The preparation method of claim 1, wherein a first conductive pad and a second conductive pad are attached to two electrodes on a top surface of a selected first semiconductor chip or a selected second semiconductor chip, wherein the first conductive pad is of an L shape with a notch formed at one corner thereof, wherein the second conductive pad is located inside the notch, and wherein the first conductive pad is thicker than the second conductive pad.

7. A preparation method of a power semiconductor device, the preparation method comprising:
    providing a first lead frame with a plurality of die paddles;
    attaching a respective first semiconductor chip to a front side of each die paddle;
    flipping the first lead frame with the respective first semiconductor chip attached to said each die paddle and then attaching a respective second semiconductor chip to a back side of said each die paddle;
    providing a second lead frame with a first plurality of conductive pads to mount on the plurality of first semiconductor chips, wherein a respective conductive pad of the first plurality of conductive pads is attached to an electrode on a top surface of each first semiconductor chip;
    providing a third lead frame with a second plurality of conductive pads to mount on the plurality of second semiconductor chips, wherein a respective conductive pad of the second plurality of conductive pads is attached to an electrode on a top surface of each second semiconductor chip;
    forming a plastic package layer covering the first lead frame, the second lead frame, the third lead frame, the plurality of first semiconductor chips and the plurality of second semiconductor chips so as to form a lamination; and
    cutting the lamination along cutting lines between adjacent die paddles,
    wherein each plastic package body of a plurality of plastic package bodies, formed by cutting the plastic package layer, covers a respective die paddle, a respective first semiconductor chip, a respective second semiconductor chip, one or more conductive pads of the first plurality of conductive pads and one or more conductive pads of the second plurality of conductive pads;
    wherein a side surface of each conductive pad of the first and second pluralities of conductive pads is exposed from a respective cutting side surface of the plurality of plastic package bodies;
    wherein a first conductive pad and a second conductive pad are attached to two electrodes on a top surface of a selected first semiconductor chip or a selected second semiconductor chip, wherein the first conductive pad is of an L shape with a notch formed at one corner thereof, wherein the second conductive pad is located inside the notch, and wherein the first conductive pad is thicker than the second conductive pad;

wherein a top surface of the first conductive pad is exposed from a top surface of a respective plastic package body;

wherein an L-shaped heat sink is attached to the exposed top surface of the first conductive pad; and wherein a side edge of the L-shaped heat sink is flush with a side surface of the respective plastic package body.

8. A preparation method of a power semiconductor device, the preparation method comprising:

providing a second lead frame with a first plurality of conductive pads;

flipping and mounting a plurality of first semiconductor chips on the second lead frame, wherein a respective first conductive pad is aligned and attached to an electrode on a top surface of each first semiconductor chip;

mounting a first lead frame with a plurality of die paddles on the plurality of first semiconductor chips, wherein an electrode at a bottom surface of each first semiconductor chip is aligned and attached to a back side of a respective die paddle;

attaching a respective second semiconductor chip of a plurality of second semiconductor chips to a front side of each die paddle;

providing a third lead frame with a second plurality of conductive pads and mounting the third lead frame on the plurality of second semiconductor chips, wherein a respective second conductive pad is aligned with and attached to an electrode on a top surface of each second semiconductor chip;

forming a plastic package layer covering the first lead frame, the second lead frame, the third lead frame, the plurality of first semiconductor chips and the plurality of second semiconductor chips so as to form a lamination; and cutting the lamination along cutting lines between adjacent die paddles, wherein each plastic package body of a plurality of plastic package bodies, formed by cutting the plastic package layer, covers a respective die paddle, a respective first semiconductor chip, a respective second semiconductor chip, one or more conductive pads of the first plurality of conductive pads and one or more conductive pads of the second plurality of conductive pads, wherein a side surface of each conductive pad of the first and second pluralities of conductive pads is exposed from a respective cutting side surface of the plurality of plastic package bodies;

wherein a respective side surface of the conductive pad of the first plurality of conductive pad, the respective cutting side surface of the plurality of plastic package bodies and a side surface of each conductive pad of the second plurality of conductive pads are located in a co-plane and wherein a respective side surface of the conductive pad of the first plurality of conductive pads, a respective side surface of the conductive pad of the second plurality of conductive pads, and a side surface of each die paddle of the plurality of die paddles are located in a co-plane.

* * * * *